United States Patent
Liu et al.

(10) Patent No.: US 9,496,268 B2
(45) Date of Patent: Nov. 15, 2016

(54) INTEGRATED CIRCUITS WITH ASYMMETRIC AND STACKED TRANSISTORS

(71) Applicant: Altera Corporation, San Jose, CA (US)

(72) Inventors: Jun Liu, Milpitas, CA (US); Yanzhong Xu, Santa Clara, CA (US); Shankar Sinha, San Jose, CA (US); Shih-Lin S. Lee, San Jose, CA (US); Jeffrey Xiaoqi Tung, Palo Alto, CA (US); Albert Ratnakumar, San Jose, CA (US); Qi Xiang, San Jose, CA (US); Irfan Rahim, Milpitas, CA (US); Andy L. Lee, San Jose, CA (US); Jeffrey T. Watt, Palo Alto, CA (US); Srinivas Perisetty, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 164 days.

(21) Appl. No.: 14/268,183

(22) Filed: May 2, 2014

(65) Prior Publication Data

US 2015/0318029 A1 Nov. 5, 2015
US 2016/0232952 A9 Aug. 11, 2016

Related U.S. Application Data

(62) Division of application No. 13/923,276, filed on Jun. 20, 2013, now Pat. No. 8,750,026, which is a division of application No. 12/629,831, filed on Dec. 2, 2009, now Pat. No. 8,482,963.

(51) Int. Cl.
*G11C 11/412* (2006.01)
*H01L 27/11* (2006.01)
(Continued)

(52) U.S. Cl.
CPC ............ *H01L 27/1104* (2013.01); *G11C 5/06* (2013.01); *G11C 7/1051* (2013.01); *G11C 11/412* (2013.01); *H01L 21/82345* (2013.01)

(58) Field of Classification Search
CPC ... G11C 11/412; G11C 11/41; G11C 7/1051; G11C 5/06; H01L 27/1104; H01L 21/82345
USPC .................................................. 365/154–156
See application file for complete search history.

(56) References Cited

U.S. PATENT DOCUMENTS

| | | | |
|---|---|---|---|
| 4,114,049 A | 9/1978 | Suzuki | |
| 4,175,290 A | 11/1979 | Harari | |

(Continued)

FOREIGN PATENT DOCUMENTS

| | | |
|---|---|---|
| CN | 1992053 | 9/1998 |
| CN | 1938858 | 3/2007 |
| WO | 2005096387 | 10/2005 |

OTHER PUBLICATIONS

Kim et al., "Relaxing Conflict Between Read Stability and Writability in 6T SRAM Cell Using Asymmetric Transistors", IEEE Electron Device Letters, vol. 30, No. 8, Aug. 2009.

(Continued)

*Primary Examiner* — Khamdan Alrobaie
(74) *Attorney, Agent, or Firm* — Treyz Law Group; Jason Tsai

(57) ABSTRACT

Asymmetric transistors may be formed by creating pocket implants on one source-drain terminal of a transistor and not the other. Asymmetric transistors may also be formed using dual-gate structures having first and second gate conductors of different work functions. Stacked transistors may be formed by stacking two transistors of the same channel type in series. One of the source-drain terminals of each of the two transistors is connected to a common node. The gates of the two transistors are also connected together. The two transistors may have different threshold voltages. The threshold voltage of the transistor that is located higher in the stacked transistor may be provided with a lower threshold voltage than the other transistor in the stacked transistor. Stacked transistors may be used to reduce leakage currents in circuits such as memory cells. Asymmetric transistors may also be used in memory cells to reduce leakage.

9 Claims, 12 Drawing Sheets

(51) Int. Cl.
  *G11C 7/10* (2006.01)
  *G11C 5/06* (2006.01)
  *H01L 21/8234* (2006.01)

(56) References Cited

U.S. PATENT DOCUMENTS

| | | | |
|---|---|---|---|
| 4,387,444 A | 6/1983 | Edwards | |
| 4,596,938 A | 6/1986 | Cartwright, Jr. | |
| 4,714,519 A | 12/1987 | Pfiester | |
| 4,894,801 A | 1/1990 | Saito et al. | |
| 5,175,605 A | 12/1992 | Pavlu et al. | |
| 5,296,401 A | 3/1994 | Mitsui et al. | |
| 5,363,328 A | 11/1994 | Browning, III et al. | |
| 5,541,549 A | 7/1996 | Kubota | |
| 5,576,238 A | 11/1996 | Fu | |
| 5,753,958 A | 5/1998 | Burr et al. | |
| 5,973,533 A | 10/1999 | Nagaoka | |
| 5,977,591 A | 11/1999 | Fratin et al. | |
| 6,033,957 A | 3/2000 | Burns, Jr. et al. | |
| 6,097,070 A | 8/2000 | Mandelman | |
| 6,110,783 A | 8/2000 | Burr | |
| 6,255,174 B1 | 7/2001 | Yu | |
| 6,278,290 B1 | 8/2001 | Young | |
| 6,466,489 B1 | 10/2002 | Ieong et al. | |
| 6,487,134 B2 | 11/2002 | Thoma et al. | |
| 6,501,295 B1 | 12/2002 | Burr | |
| 6,620,679 B1 | 9/2003 | Tzeng et al. | |
| 6,653,698 B2 | 11/2003 | Lee et al. | |
| 6,807,081 B2 * | 10/2004 | Nii | 365/145 |
| 6,949,423 B1 | 9/2005 | Ma et al. | |
| 7,193,269 B2 | 3/2007 | Toda et al. | |
| 7,307,905 B2 | 12/2007 | Najm et al. | |
| 7,332,780 B2 | 2/2008 | Matsuda et al. | |
| 7,362,606 B2 | 4/2008 | Chuang et al. | |
| 7,408,800 B1 | 8/2008 | Braceras et al. | |
| 7,436,696 B2 | 10/2008 | Wang et al. | |
| 7,504,850 B2 | 3/2009 | Kuboyama et al. | |
| 7,511,989 B2 | 3/2009 | Thomas et al. | |
| 7,532,501 B2 | 5/2009 | Joshi et al. | |
| 7,545,007 B2 | 6/2009 | Greer et al. | |
| 7,580,317 B2 * | 8/2009 | Kato | 365/230.05 |
| 7,652,520 B2 | 1/2010 | Gatta | |
| 7,672,152 B1 | 3/2010 | Kulkarni et al. | |
| 7,876,602 B2 | 1/2011 | Lawrence et al. | |
| 7,888,959 B2 | 2/2011 | Cannon et al. | |
| 7,920,410 B1 | 4/2011 | Lee et al. | |
| 8,036,022 B2 | 10/2011 | Anderson et al. | |
| 8,116,118 B2 | 2/2012 | Thomas et al. | |
| 8,138,797 B1 | 3/2012 | Liu et al. | |
| 8,482,963 B1 | 7/2013 | Liu et al. | |
| 8,638,594 B1 | 1/2014 | Sinha et al. | |
| 2001/0017390 A1 | 8/2001 | Long et al. | |
| 2003/0141525 A1 | 7/2003 | Nowak | |
| 2003/0181005 A1 | 9/2003 | Hachimine et al. | |
| 2004/0140483 A1 | 7/2004 | Yonemaru | |
| 2005/0224897 A1 | 10/2005 | Chen et al. | |
| 2006/0187700 A1 | 8/2006 | Ho | |
| 2007/0029587 A1 | 2/2007 | Greer et al. | |
| 2007/0262382 A1 | 11/2007 | Ishii et al. | |
| 2008/0308870 A1 | 12/2008 | Faul et al. | |
| 2009/0185409 A1 | 7/2009 | Bansal et al. | |
| 2009/0218631 A1 * | 9/2009 | Zhu et al. | 257/369 |
| 2010/0080035 A1 | 4/2010 | Venkatraman et al. | |
| 2010/0127331 A1 | 5/2010 | Ratnakumar et al. | |
| 2010/0127332 A1 | 5/2010 | Liu et al. | |
| 2010/0177556 A1 | 7/2010 | Chen et al. | |

OTHER PUBLICATIONS

Zhou et al. "A Novel Hetero-Material Gate (HMG) MOSFET for Deep-Submicron ULSI Technology", IEEE Transactions on Electron Devices, vol. 45, No. 12, Dec. 1998.
Rahim et al., U.S. Appl. No. 12/568,638, filed Sep. 28, 2009.
Xiang et al., U.S. Appl. No. 12/069,271, filed Feb. 8, 2008.
Xiang et al., U.S. Appl. No. 60/964,917, filed Aug. 16, 2007.

* cited by examiner though inventions, its nature and various

INTEGRATED CIRCUITS WITH ASYMMETRIC AND STACKED TRANSISTORS

This application is a divisional of patent application Ser. No. 13/923,276, filed Jun. 20, 2013, which is a divisional of patent application Ser. No. 12/629,831, filed Dec. 2, 2009, which are hereby incorporated by reference herein in their entirety.

BACKGROUND

This invention relates to integrated circuits, and more particularly, to circuitry such as memory circuitry that may incorporate asymmetric transistors and stacked transistors.

There is a trend with each successive generation of integrated circuit technology to scale transistors to smaller sizes, smaller threshold voltages, and smaller power supply voltages. Made properly, these adjustments allow improved performance and lowered costs. Care must be taken, however, to avoid issues such as excessive power consumption.

One aspect of lowering power consumption on an integrated circuit relates to transistor leakage currents. Leakage currents are undesired currents that flow between the terminals of a transistor during normal operation. An ideal transistor would exhibit no leakage. In the real world, however, leakage currents are unavoidable and must be minimized as best possible. If leakage currents are too high, a circuit may exhibit unacceptably large static power consumption. Particularly in circuits with large numbers of transistors, such as modern integrated circuits that include memory cells, leakage current minimization can be highly beneficial. Although leakage currents can be reduced by limiting power supply voltages and using less leaky transistors such as transistors with increased threshold voltages and reduced gate widths, these approaches tend to slow circuit speed and may not be acceptable for many designs.

It would therefore be desirable to be able to provide transistor structures that help improve the tradeoffs that exist between transistor performance and leakage current reduction.

SUMMARY

An integrated circuit may be provided with asymmetric transistors and stacked transistors. Memory cells and other circuits in the integrated circuit may be provided with asymmetric transistors. For example, asymmetric transistors may be used as address transistors. Memory cells and other circuits in the integrated circuit may also be provided with stacked transistors. For example, stacked transistors may be used to replace some or all of the transistors used in forming bistable elements for memory cells.

Asymmetric transistors may be formed by creating an energy barrier at one source-drain terminal of a transistor and not the other. The energy barrier may be formed by creating a dopant implant of opposite doping type to that of the source-drain. Asymmetric transistors may also be formed using dual-gate structures having first and second gate conductors of different work functions.

Stacked transistors may be formed by stacking two transistors of the same channel type in series (i.e., two n-channel devices or two p-channel devices). One of the source-drain terminals of each of the two transistors is connected to a common node. The gates of the two transistors are also connected together. The two transistors may have different threshold voltages. The threshold voltage of the transistor that is located higher in the stacked transistor may be provided with a lower threshold voltage than the other transistor in the stacked transistor.

Further features of the invention, its nature and various advantages will be more apparent from the accompanying drawings and the following detailed description of the preferred embodiments.

DETAILED DESCRIPTION

Figure 1:
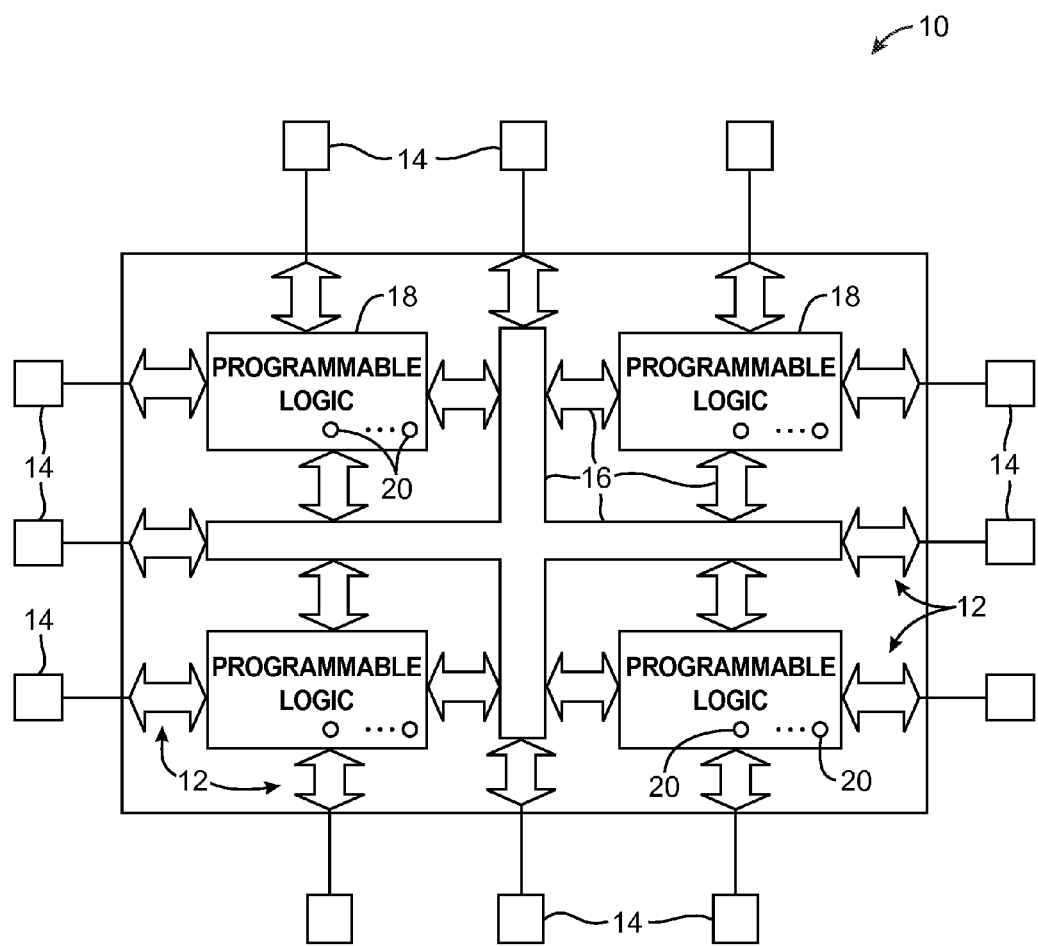
FIG. 1 is a diagram of an illustrative integrated circuit that may contain transistor structures in accordance with an embodiment of the present invention.

An illustrative integrated circuit that may contain asymmetric and stacked transistors is shown in FIG. 1. As shown in FIG. 1, integrated circuit 10 may include memory elements (cells) 20.

Memory elements 20 can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the use of memory elements 20 is sometimes be described in the context of programmable integrated circuits such as programmable logic device integrated circuits. This is, however, merely illustrative. Memory cells 20 and the asymmetric and stacked transistors in such memory cells may be used in any suitable circuits.

On integrated circuits such as memory chips or other circuits in which memory is needed to store processing data, memory elements 20 can be used to perform the functions of static random-access memory (RAM) cells and are sometimes referred to as SRAM cells. In the context of programmable logic device integrated circuits, memory elements 20 can be used to store configuration data and are therefore sometimes referred to in this context as configuration random-access memory (CRAM) cells.

As shown in FIG. 1, device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Integrated circuit 10 may contain volatile memory elements 20. For example, integrated circuit 10 may be a programmable integrated circuit such as a programmable logic device integrated circuit that can be loaded with configuration data (also called programming data) using pins 14 and input/output circuitry 12. Once memory elements 20 are loaded in this way, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit (i.e., a latch-type circuit). True and complement data storage nodes in the bistable circuit element can store corresponding true and complement versions of a data bit.

A bistable circuit element may be based on any suitable number of transistors. For example, the bistable portion of each memory element may be formed from cross-coupled inverters, from groups of multiple inverter-like circuits (e.g., in a distributed configuration that provides enhanced immunity from soft-error-upset events, etc.). Arrangements with bistable elements formed from cross-coupled inverter pairs are sometimes described herein as an example. This is, however, merely illustrative. Memory elements 20 may be formed using any suitable memory cell architecture.

With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from any suitable source of data. As an example, memory elements 20 may be loaded with configuration data from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern integrated circuit such as a programmable integrated circuit, there may be millions of memory elements 20 on each chip. During programming operations, the array of memory elements is provided with configuration data by a user (e.g., a logic designer). Once loaded with configuration data, the memory elements 20 produce static control signals at their outputs that selectively control portions of the circuitry in the programmable logic 18 and thereby customize its functions so that it will operate as desired.

The circuitry of device 10 may be organized using any suitable architecture. As an example, the logic of device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

When memory elements 20 are arranged in an array, horizontal and vertical conductors and associated loading circuitry may be used to load the memory elements with configuration data. Any suitable memory array architecture may be used for memory elements 20. One suitable arrangement is shown in FIG. 2.

Figure 2:
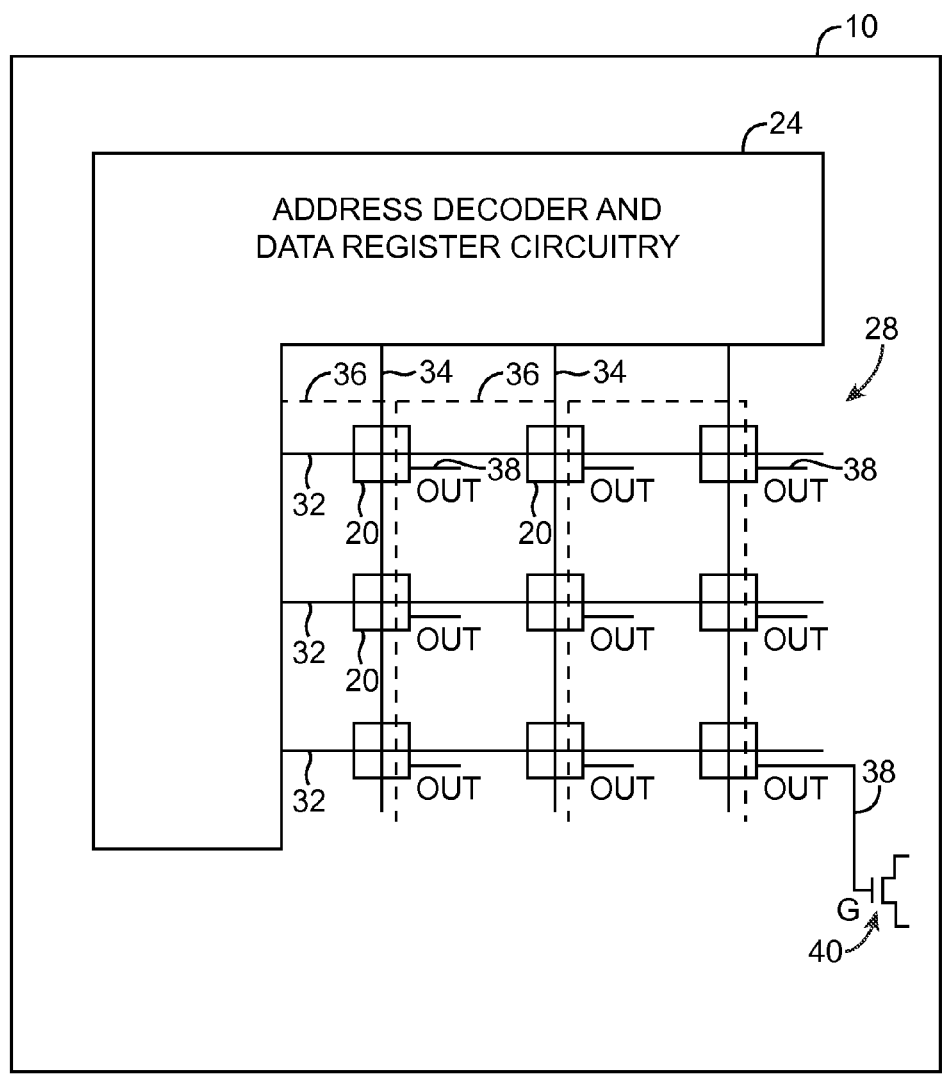
FIG. 2 is a diagram of an illustrative array of memory cells in accordance with an embodiment of the present invention.

As shown in FIG. 2, control circuitry 24 may be used to read and write data from memory cells 20 in memory cell array 28. When array 28 is being used as regular SRAM, data write operations may be performed when it is desired to store processing results and data read operations may be performed when it is desired to retrieve stored data. When array 28 is being used as CRAM, data write operations may be performed to load configuration data and data read operations may be performed to confirm that configuration data loading operations have been performed successfully. In CRAM environments and certain SRAM environments, read speeds may be less critical than in conventional SRAM environments, because read operations may be performed relatively infrequently (e.g., mostly when confirming that configuration data has been written properly into a CRAM array). During normal operation of a circuit contains an array of CRAM cells (i.e., when CRAM cells are neither being written to or read from), the static output of each CRAM cell can be used to control a respective programmable logic component such as a transistor. For example, the output signal OUT from each cell 20 may be provided to the gate G of a corresponding pass transistor such as n-channel metal-oxide-semiconductor transistor 40 (i.e., programmable logic transistors such as transistor 40 in blocks of programmable logic 18).

Array 28 may include rows and columns of memory cells 20. In the example of FIG. 2, there are three rows and three columns of memory elements 20 in array 28. This is merely illustrative. Integrated circuits such as integrated circuit 10 may have any suitable number of memory elements 20. A typical memory array might, as an example, have thousands or millions of memory elements 20 arranged in hundreds or thousands or rows and columns.

Lines such as lines 32, 34, 36, and 38 may be used to distribute signals in array 28. One or more lines per column such as lines 34 may be used to load data into cells 20 and may be used to read data out from cells 20. Lines 34 may sometimes be referred to as data lines or bitlines. One or more lines 34 per row may be used to convey address signals and may sometimes be referred to as address lines or word lines. In some array configurations, the cells of the array may be cleared (e.g., during power-up operations). Array 28 may be cleared by writing zeros into the array using through the data lines or by asserting one or more global clear signals using a global (or nearly global) network of clear lines such as clear lines 36.

During data writing operation, write drivers in circuitry 24 may supply data to array 28 on lines 34 (e.g., in appropriate columns of the array) while appropriate address lines are asserted to define the desired array location (i.e., the appropriate rows of the array) to which the data is to be written. During read operations, appropriate address lines are asserted to define the desired array location from which data is to be read (i.e., appropriate rows) while the outputs of appropriate data lines 34 are monitored (e.g., using sense amplifiers). Single-ended and differential schemes may be used for reading and/or writing. In differential write schemes, a pair of true and complement data lines are used. In differential read schemes, a differential sense amplifier may be used in reading signals from a pair of true and complement data lines.

In circuits such as circuit 10, asymmetric transistors and/or stacked transistors can be used to improve the tradeoff between transistor performance (i.e., drive strength and therefore speed) and leakage current (i.e., static power consumption). These arrangements may be used to improve transistor speed while maintaining existing levels of leakage current performance or even somewhat relaxing leakage current performance. These arrangements may also be used to improve leakage current performance while maintaining or even somewhat reducing transistor performance. Arrangements in which leakage current and transistor performance are simultaneously improved are also possible.

A metal-oxide-semiconductor (MOS) transistor has four terminals: a source, a drain, a gate that overlies a channel region, and a body. The source and drain are sometimes collectively referred to as source-drain terminals. By convention, the drain of an MOS transistor is typically the source-drain terminal that is biased high, whereas the source is grounded or biased at a lower voltage. Because the labels "source" and "drain" may therefore be context-sensitive, it may sometimes be clearest to refer to the both the source and the drain of a MOS transistor as being "source-drain" terminals or "source-drains."

In a symmetric transistor, the source-drain terminals of the transistors are substantially identical. It therefore does not matter whether the source-drain terminals of a symmetrical transistor are reversed, as performance will not significantly change. In an asymmetric transistor, however, there is an energy barrier at one of the source-drain terminals that is not present at the other of the source-drain terminals. This leads to different performance characteristics depending on how the transistor is operated.

Asymmetric transistors may be formed by adjusting the sizes, shapes, and materials of the structures that make up the transistor. With one suitable arrangement, an asymmetric transistor is formed by making a one-sided energy-barrier-inducing pocket implant. This type of approach is shown in FIGS. 3, 4, and 5.

Figure 3:
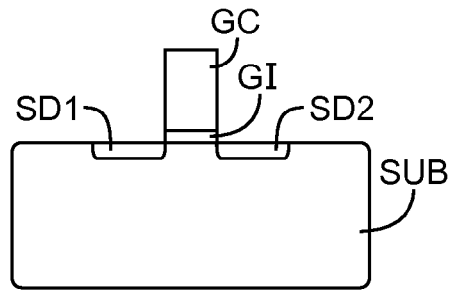
FIGS. 3, 4, and 5 are cross-sectional side views of an asymmetric transistor that has an energy-barrier-inducing pocket implant during three successive stages of fabrication in accordance with an embodiment of the present invention.

Initially, as shown in FIG. 3, a gate conductor GC is formed on a gate insulator GI and a low density ion implantation process is used to implant dopant to form source-drains SD1 and SD2 in substrate SUB. Gate conductor GC may be formed from doped polysilicon, metal, or other suitable conductive materials. Gate insulator GI may be formed from silicon dioxide, a high-K material such as a hafnium-based oxide, other oxides, nitrides, and oxynitrides, or other suitable insulating material. Substrate SUB may be formed from a semiconductor such as silicon (e.g., silicon in a bulk silicon wafer, a layer of epitaxial silicon on a bulk or silicon-on-insulator wafer, etc.). Substrates of other semiconductors may also be used.

Figure 4:
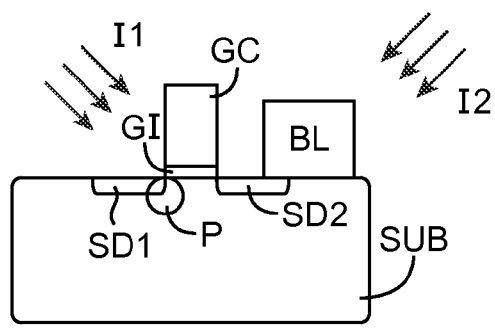
Figure 5:
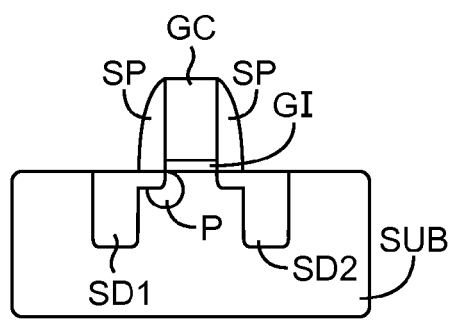

As shown in FIG. 4, a blocking layer BL may be formed over one of the source-drain terminals. Blocking layer BL may be formed from any suitable type of material. For example, blocking layer BL may be formed from a layer of photolithographically patterned photoresist. During a subsequent ion implantation step, ions I1 are not blocked and form energy-barrier-inducing pocket implant P, whereas ions I2 are blocked and do not form an energy-barrier inducing pocket implant.

The doping type of the pocket implant P in an asymmetric transistor is of the opposite doping type to that of the source-drain implants. For example, if the source-drains of a given transistor are n-type, the pocket implant in that transistor will be p-type (i.e., p+). In n-channel metal-oxide-semiconductor (NMOS) asymmetric transistors, the source-drain terminals are n-type and doping type of semiconductor channel region is p-type. The pocket implant in an NMOS asymmetric transistor will therefore be p-type. In p-channel metal-oxide-semiconductor (PMOS) asymmetric transistors, the source-drain terminals are p-type. The pocket implant in a p-channel asymmetric transistor will therefore be n-type.

To complete formation of the source-drain terminals, a high density implant operation may be performed. Spacers SP (FIG. 5) may help define the locations of the high density implant. Spacers SP may be formed from silicon oxide (as an example). Following the high-density implant, the source-drains of the transistor appear as shown in FIG. 5. Because the pocket implant P is only present at source-drain SD1, the operation of the transistor is not symmetrical.

Figure 6:
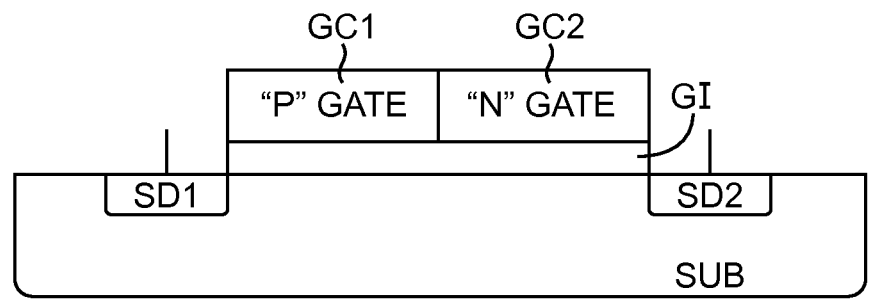
FIG. 6 is a cross-sectional side view of an asymmetric transistor having a dual gate structure in accordance with an embodiment of the present invention.

Another way in which to form an asymmetric transistor involves the use of a dual gate structure. As shown in FIG. 6, for example, gate conductor GC may be formed from a gate metal GC1 that has a different work function than gate metal GC2.

Over the portion of the channel region that would conventionally contain an energy-barrier-inducing pocket implant, the gate may be formed from a metal with a relatively high work function. In an n-channel metal-oxide-semiconductor transistor, this metal may, for example, have a work function of about 5.1 eV, which makes its electrical performance comparable to that of a heavily doped p-type gate conductor such as a p+ polysilicon gate conductor. Over the remaining portion of the channel region in the re-channel transistor, the gate may be formed from a metal that has a relatively low work function. This portion of the gate may, for example, have a work function of about 4.2 eV, which makes its electrical performance comparable to that of a heavily doped n-type gate conductor such as an n+ polysilicon gate conductor. Other arrangements may also be used such as arrangements in which the metal work functions for different gate conductors differ by different amounts (e.g., by less than 0.3 eV, by 0.3 eV or more, by at least 0.6 eV, by at least 0.9 eV, etc.). P-channel metal-oxide-semiconductor asymmetric transistors may also be formed using mixed gates (i.e., gate conductors with different work functions).

Both the asymmetric transistor of FIG. 5 and the asymmetric transistor of FIG. 6 may be characterized by an asymmetric band diagram exhibiting an energy barrier EB at only one of the two source-drain terminals.

Figure 8:
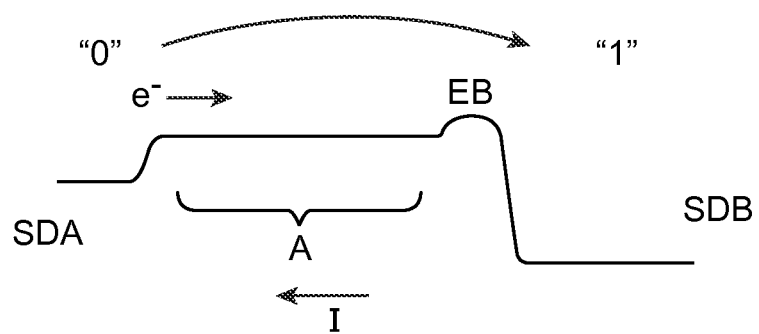
FIG. 8 is a band diagram showing how an asymmetric transistor operates in a strong mode when driving a logic zero onto a logic one to overwrite the one with the zero in accordance with an embodiment of the present invention.
Figure 9:
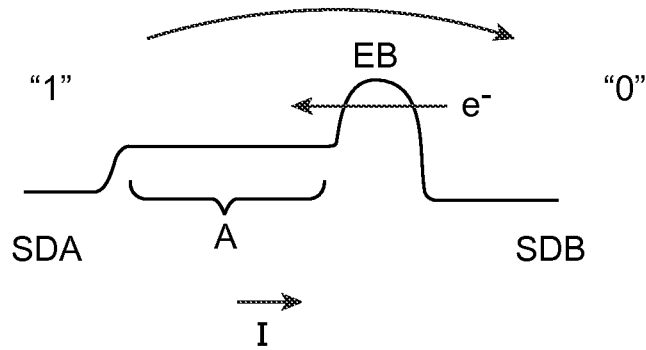
FIG. 9 is a band diagram showing how an asymmetric transistor operates in a weak mode when driving a logic one onto a zero to overwrite the zero with the one in accordance with an embodiment of the present invention.

The asymmetric performance of an asymmetric transistor may be understood with reference to the energy band diagrams of FIGS. 8 and 9.

When writing a logic zero from source-drain SDA to source-drain SDB, electrons initially need not overcome barrier EB. Rather, electrons may accelerate due to the electric field present in region A. After accelerating in region A, the electrons can surmount energy barrier EB with relative ease. The configuration of FIG. 8 therefore represents a configuration in which the asymmetric transistor is relatively strong (i.e., the transistor is operating in a "strong mode").

Figure 7:
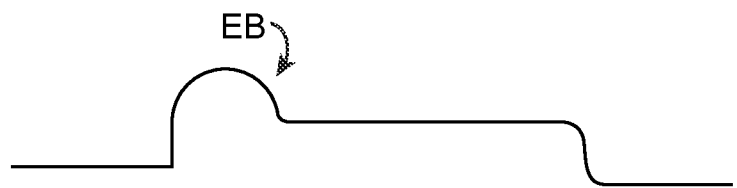
FIG. 7 is a band diagram of an asymmetric transistor showing how an energy barrier is formed at one of the source-drains of the transistor in accordance with an embodiment of the present invention.

When writing a logic one from source-drain SDA to source-drain SDB, however, electrons are initially required to surmount energy barrier EB, before reaching region A. This is a less favorable condition than the situation in FIG. 7 and results in a lower current I for a given applied gate voltage than the situation in FIG. 7. The configuration of FIG. 9 therefore represents a configuration in which the asymmetric transistor is weaker than in the configuration of FIG. 8 (i.e., the transistor is operating in a "weak mode").

Figure 10:
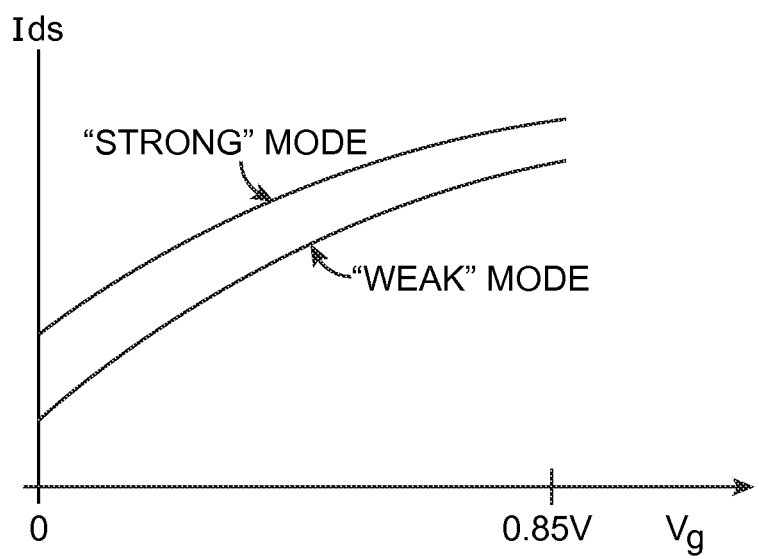
FIG. 10 is a graph showing how the amount of current that flows through an asymmetric transistor as a function of applied gate voltage varies as a function of whether the asymmetric transistor is being operated in a strong mode or a weak mode in accordance with an embodiment of the present invention.

A graph showing how more drain-source current flows through an asymmetric transistor when operated in the strong mode rather than the weak mode is shown in FIG. 10. Because more current flows in the strong mode than in the weak mode for a given gate voltage, the performance of the asymmetric transistor varies depending on how the transistor is being used. This property may be exploited in circuits such as memory cell circuits, because the asymmetric transistors can be used as address transistors that are configured to operate in their strong mode during data loading operations while operating in their weak mode during holding operations. The enhanced strength of the asymmetric transistors when used in strong mode can improve write margin (i.e., the asymmetric transistor in this situation is operating as if its threshold voltage had been decreased). The weakness of the asymmetric transistors during hold mode can result in lower leakage current (i.e., the asymmetric transistor in this situation is operating as if its threshold voltage had been increased).

In addition to serving as address transistors, asymmetric transistors may be used in other portions of a memory cell or in other circuits on device 10. In some configurations, stacked transistors that are formed from multiple series-connected transistors, may be used alone or in combination with asymmetric transistors. For example, memory cells and other circuits may be provided with both stacked transistors and asymmetric transistors.

Figure 11:
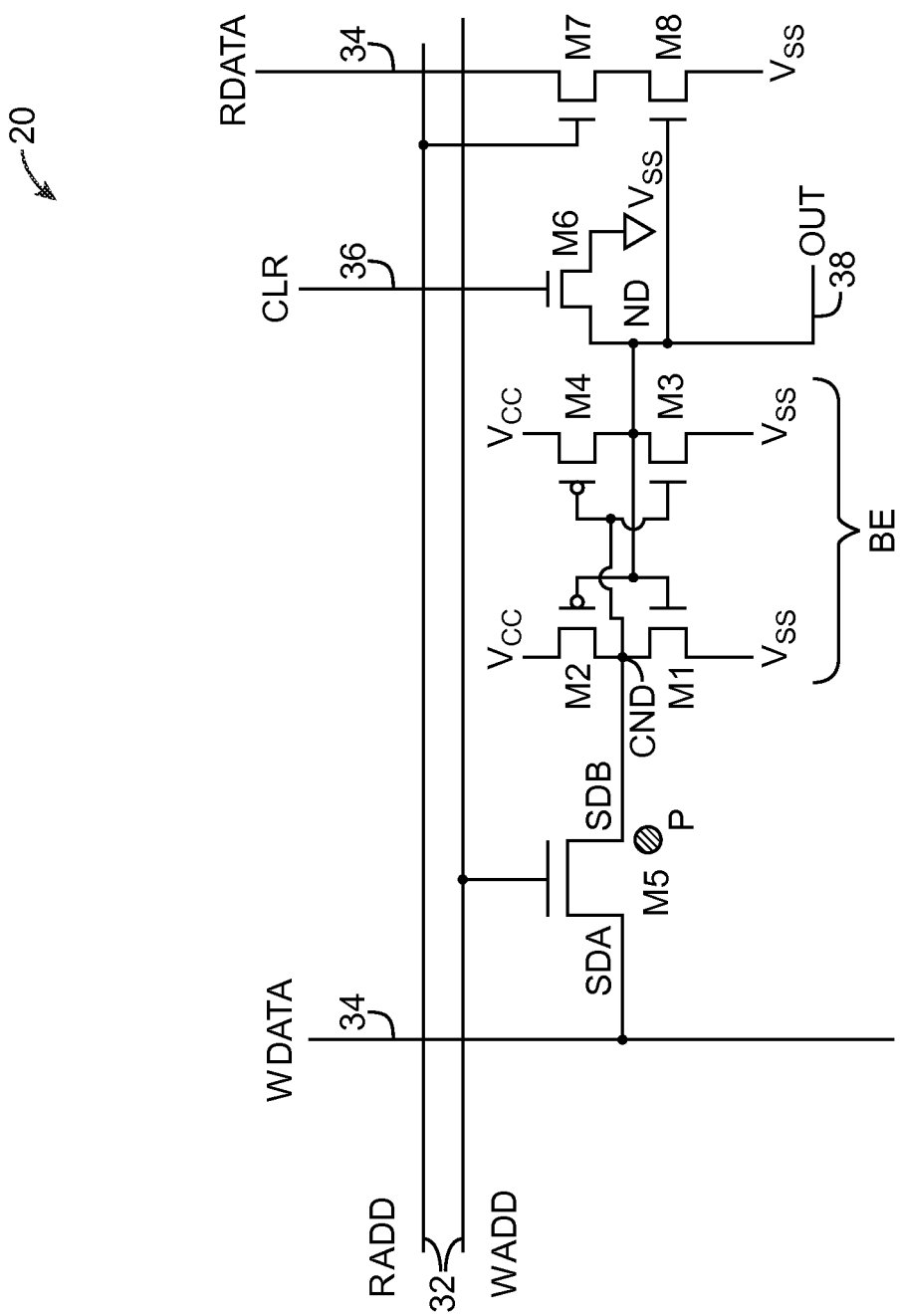
FIG. 11 is a diagram of an illustrative memory cell with a single-ended writing and single-ended reading configuration in accordance with an embodiment of the present invention.

An illustrative memory cell circuit in which asymmetric transistors and stacked transistors may be used is shown in FIG. 11.

As shown in FIG. 11, memory cell 20 may include a bistable element BE that stores a data bit (i.e., a "1" or a "0"). Bistable element BE may be formed from any suitable number of transistors. In the example of FIG. 11, bistable element BE is formed from a pair of cross-coupled inverters. A first of these inverters is formed by transistors M1 and M2. A second of these inverters is formed from transistors M3 and M4. These inverters are said to be "cross-coupled," because the output of the first inverter is connected to the input of the second inverter and vice versa. The transistors of bistable element BE may be powered using any suitable power supply voltages. For example, bistable element BE may be powered by a positive power supply voltage Vcc (e.g., a voltage in the range of 0.7 to 1.1 volts as an example) and a ground power supply voltage (e.g., 0 volts or other suitable ground voltage).

Cell 20 may include true and complement data storage node. True data storage node ND may hold a true version of the data bit that is being stored in cell 20. Complementary data storage node CND may store an inverted (complementary) version of the data bit on node ND. These stored values are therefore complementary to each other, but both represent the same stored data. Either the data on node ND or the data on node CND may be used as an output. In the example of FIG. 11, the data bit on node ND is used as an output signal OUT on line 38.

Cell 20 may receive address signals such as read address signal RADD and write address signal WADD on address lines (word lines) 32. Write address signal WADD and read address signal RADD may be asserted independently. During write operations, write control signal WADD is systematically asserted (e.g., taken high) in each row into which data is being written, while all read address signals RADD in the memory array are maintained low (e.g., by deasserting all RADD lines). During read operations, all WADD signals in the array are deasserted, while read control signal RADD is systematically asserted in all rows of memory array from which it is desired to read data.

Data may be routed to and from memory cell 20 using data lines (bit lines) 34. Data that is to be written into cell 20 may be provided to cell 20 on as write data signal WDATA. Data read from cell 20 (RDATA) may be read out from bistable element BE using an address transistor or, as shown in the example of FIG. 11, using a read assistance circuit made up of transistors such as transistors M7 and M8. During reading, signal RADD is asserted (e.g., taken high) to turn on read access transistor M7, while the signal RDATA is monitored to detect the value of the current bit stored on node ND. If ND is high, M8 will be turned on and RDATA will be connected to Vss (e.g., a ground voltage of 0 V). If the bit stored on node ND of cell 20 is low, transistor M8 of the read assistance circuit will be turned off and RDATA will remain at a precharged value (e.g., Vcc) during read operations.

Clear signals may be supplied to clear transistor M6 during power-up operations (i.e., signal CLR may be asserted when cell 20 is powered up, thereby clearing cell 20 and ensuring that output signal OUT on output line 38 will initially be low).

Transistor M5 may be formed from an asymmetric transistor. With this type of arrangement, the asymmetric performance of transistor M5 can help improve the tradeoff between leakage and performance for cell 20.

During power-up, cells 20 are cleared. This places a logic zero on the data storage node ND in each cell (i.e., a ground voltage Vss) and a logic high on each complementary data storage node CND. When loading data into array 28 (FIG. 2), the states of memory cells 20 therefore only need to be changed when it is desired to overwrite the stored zero with a logic one (i.e., to cause ND to flip from zero to one). The cells that are cleared and that are supposed to remain in that cleared state after data loading operations (i.e., the cells that are being "loaded" with zeros) do not change state during data write operations.

A "flip" of node ND from zero to one is accomplished by driving a logic zero onto complementary data node CND. In cleared cells, CND is initially at a logic one value. Successful data writing operations therefore involve overpowering bistable element BE so that the initial logic one on node CND is overwritten with a logic zero.

When driving a logic zero onto node CND to replace a logic one on node CND, the asymmetric nature of transistor M5 assists the writing process. As shown in FIG. 11, an energy-barrier-inducing pocket implant P or the higher work function gate conductor in an asymmetric transistor of the type shown in FIG. 6 is located in source-drain SDB. Source-drain SDB is connected to node CND. Data loading operations that involve overwriting a logic one on node CND with a logic zero involve use of asymmetric transistor M5 in its strong mode, as described in connection with FIG. 8. The use of an asymmetric transistor for transistor M5 of cell 20 therefore can improve the tradeoff between transistor strength and leakage current. If, for example, increased write margin is desired, the asymmetric nature of transistor M5 may be used to increase transistor strength without requiring a reduction in the threshold voltage of transistor M5 or an increase in the gate width for transistor M5. Strength can thus be increased without increasing leakage current. If, on the other hand, it is desired to maintain an existing level of write margin in cell 20, the asymmetric nature of transistor M5 may be used to maintain the write strength of transistor M5 while the gate width for transistor M5 and/or the threshold voltage for transistor M5 are reduced to lower leakage. Balanced designs are also possible in which write margin is somewhat increased while leakage current values are somewhat decreased through the use of slightly smaller gate widths and/or slightly higher threshold voltages.

When using an asymmetric transistor for transistor M5 of cell 20, transistor M5 exhibits a weakened ability to drive a logic zero from node CND onto a logic one on source-drain SDA. This is acceptable in the cell arrangement of FIG. 11, because read operations do not involve the use of transistor M5. It is therefore not necessary for transistor M5 to be used to transfer data. Rather, transistor M5 need only be used to hold data in bistable element BE in its weak mode. Data may be read from node ND by asserting read address signal RADD to control the read assistance circuit made up of transistors M7 and M8 or other suitable read circuitry.

In the example of FIG. 11, write operations involve use of a single-ended approach to write data onto node CND and read operations involve use of a single-ended approach to read data from node ND. Clear operations are also performed by controlling the voltage on only one of the two complementary data nodes in bistable element BE (i.e., by asserting signal CLR to turn on transistor M6 and thereby short node ND to ground).

If desired, differential schemes may be used for writing, reading, and/or clearing operations. For example, a pair of address transistors may be used for performing differential write operations and the same pair of address transistors may be used for performing differential read operations. With this type of arrangement, clear operations may be performed by loading cells with logic zeros. Asymmetric transistors may be used for one or both of the address transistors with this type of approach.

Figure 12:
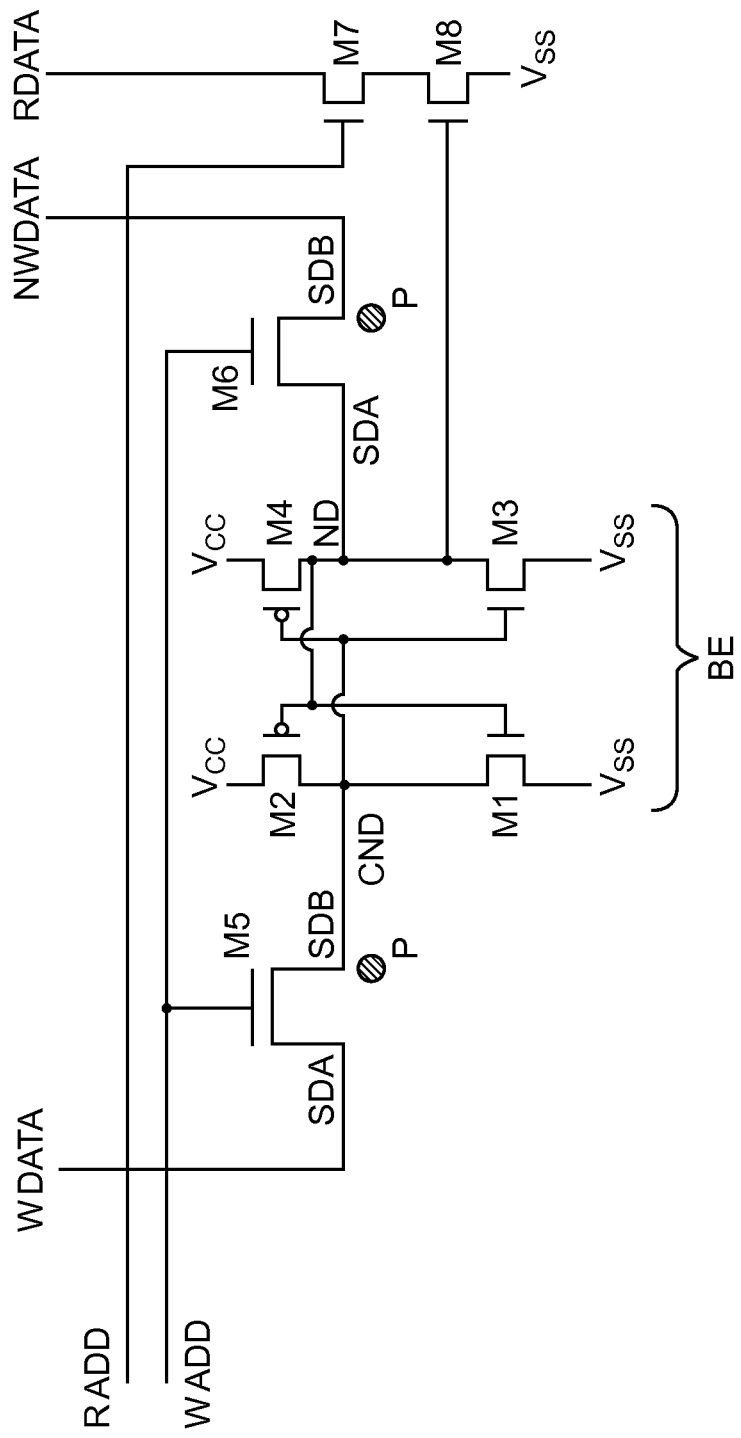
FIG. 12 is a diagram of an illustrative memory cell with a differential writing and single-ended reading configuration in accordance with an embodiment of the present invention.

Another illustrative arrangement is shown in FIG. 12. As shown in FIG. 12, a differential access scheme may be used for write operations (and clear operations, which involve the writing of zeros into the cell), whereas a single-ended arrangement may be used for read operations (using, in this example, read circuit M7/M8). To ensure that the asymmetric nature of address transistors M5 and M6 assists during differential write operations, the source-drain with the energy-barrier-inducing pocket implant P for transistor M5 (SDB) may be connected to node CND, whereas the source-drain with the energy-barrier-inducing pocket implant for transistor M6 (SDB) may be connected to the complementary write data line NWDATA.

Figure 13:
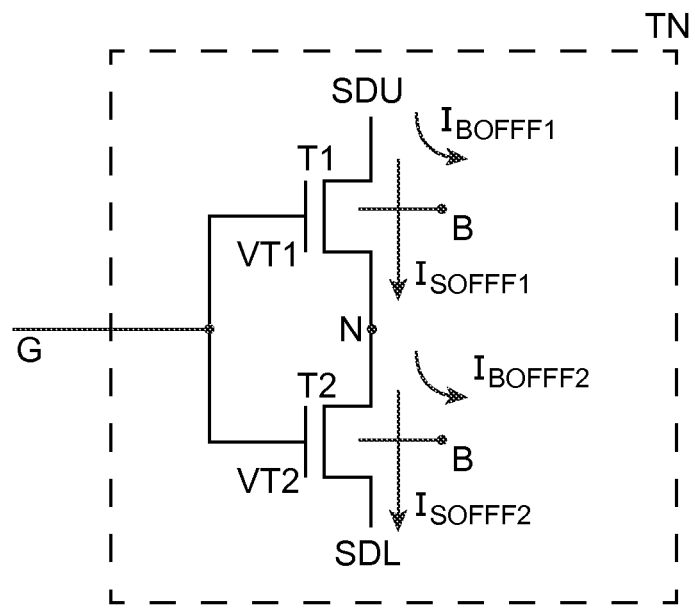
FIG. 13 is a diagram of an illustrative n-channel transistor formed from a pair of stacked transistors in accordance with an embodiment of the present invention.
Figure 14:
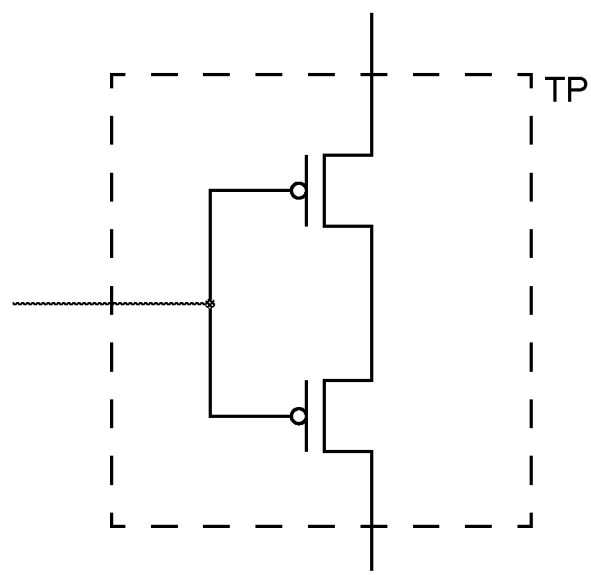
FIG. 14 is a diagram of an illustrative p-channel transistor formed from a pair of stacked transistors in accordance with an embodiment of the present invention.

Leakage currents in memory cells 20 and other circuits on device 10 may also be reduced using stacked transistors. An illustrative n-channel metal-oxide-semiconductor (NMOS) stacked transistor TN is shown in FIG. 13. An illustrative p-channel metal-oxide-semiconductor (PMOS) stacked transistor TP is shown in FIG. 14. The use of NMOS stacked transistors is sometimes described herein as an example. This is, however, merely illustrative. Both NMOS and PMOS transistors may, in general, be implemented using stacked transistor configurations.

As shown in the example of FIG. 13, stacked transistor TN may be formed from two (or more) individual transistors of the same channel type (i.e., both having p-type doping in their channels because they are both re-channel devices) that are connected in series and that share a common gate terminal G. In particular, transistor TN may have a first NMOS transistor T1 and a second NMOS transistor T2, each of which has an n-type source-drain terminal coupled to common node N. The other n-type source-drain terminals of transistors T1 and T2 (i.e., SDU and SDL) may be connected to other circuitry on device 10. Each of the transistors that make up stacked transistor TN may have four terminals (two source-drain terminals, a gate, and a body B).

There are two contributions to static leakage-body leakage current Iboff and source-drain leakage current Isoff. As shown in FIG. 13, transistor T1 is characterized by leakage currents Iboff1 and Isoff1, whereas transistor T2 is characterized by Iboff2 and Isoff2. Because of the series connection between transistors T1 and T2, the currents Isoff1 and Isoff2 are equal. This can help limit the amount of leakage current exhibited by transistor TN relative to regular (non-stacked) transistor designs.

Figure 15:
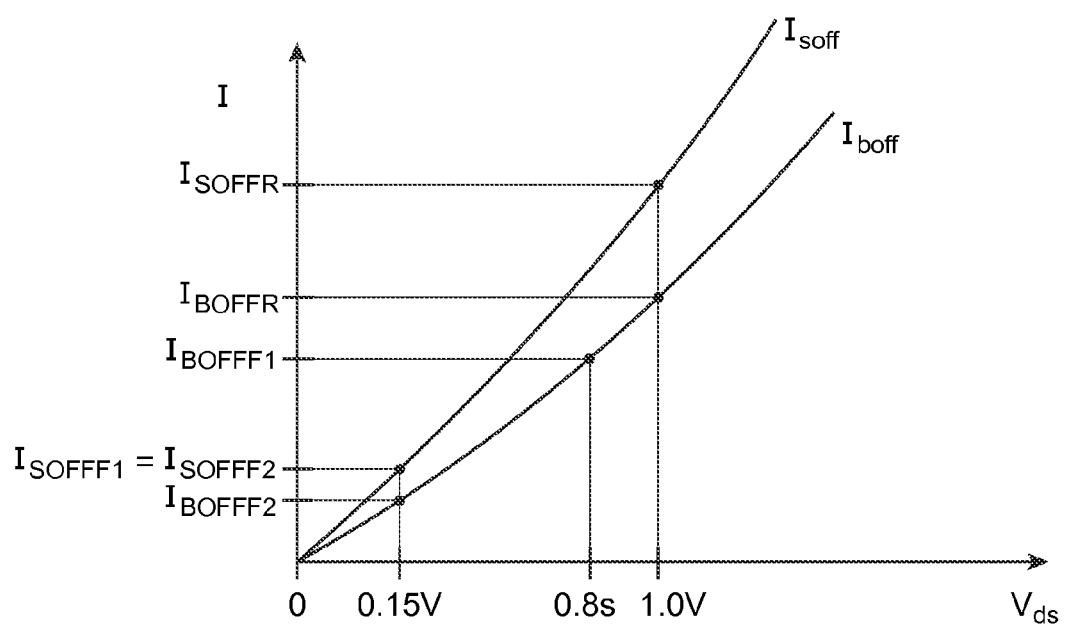
FIG. 15 is a graph showing how leakage currents can be minimized using a stacked transistor in accordance with an embodiment of the present invention.

The way in which leakage currents are limited in stacked transistors can be understood with reference to the graph of FIG. 15. In the graph of FIG. 15, leakage currents Iboff and Isoff are plotted as a function of drain-source voltage Vds. As shown in FIG. 15, the value of Isoff is exponentially proportional to the value of Vds. In a stacked transistor such as transistor TN of FIG. 13, however, the value of Isoff1 cannot exceed the value of Isoff2, because T1 and T2 are connected in series.

Consider, as an example, a scenario in which terminal SDU is biased at 1.0 volts and terminal SDL is biased at 0 volts. Gate G is biased at 0 volts to turn off transistor TN. With gate G at 0 volts, the gates of both transistors T1 and T2 are at 0 volts. The voltage at node N in this type of situation will tend to equilibrate at a value near to the voltage at SDL. For example, the voltage at node N might be 0.15 volts (as an example). In a conventional (not stacked) transistor, the drain-source voltage of the transistor would be 1.0 volts and the transistor would exhibit leakage currents of Isoffr and Iboffr. In a stacked transistor such as stacked transistor TN of FIG. 13, however, the drain-source voltage of transistor T2 would be only 0.15 volts. As a result, the value of Isoff for transistor T2 and, because of the series connection between transistors T1 and T2, the value of Isoff for transistor T1, would be smaller (see, e.g., currents Isofff1 for T1 and Isofff2 for T2 in the graph of FIG. 15). The amount of source-drain leakage in a stacked transistor is therefore significantly lower than that of an unstacked transistor.

Iboff for transistor T2 will be relatively low (see, e.g., Ibofff2 in FIG. 15), due to the reduced value of Vds for transistor T2. The leakage current Ibofff1 for transistor T1 in stacked transistor TN will also be lower than Iboffr.

Further reductions in leakage current may be achieved by lowering the threshold voltage of transistor T1 relative to that of transistor T2. The value of Iboff tends to decrease with reductions in threshold voltage and tends to increase with increases in threshold voltage. To reduce Iboff1, the threshold voltage VT1 of transistor T1 may therefore be lowered. For example, threshold voltage VT1 of transistor T1 may be lowered relative to threshold voltage VT2 of transistor T2. When VT1 is reduced relative to VT2, Iboff1 will be reduced, thereby reducing the overall Iboff of stacked transistor TN. Isoff1 will not be able to rise in response to the reduction in VT1, because Isoff1 is pinned at the value of Isoff2 due to the series connection of T1 and T2.

In a typical semiconductor fabrication process, it may be possible to fabricate different types of transistors on the same integrated circuit die. For example, the process may allow a circuit designer to choose between two, three, or more than three different transistor types, each of which may have a different threshold voltage. A process may, for example, allow a first set of transistors to be fabricated with a threshold voltage of about 0.05 volts to 0.15 volts (so-called low VT or LVT transistors), a second set of transistors to be fabricated with a threshold voltage of about 0.15 volts to 0.3 volts (so-called high VT or HVT transistors), and a third set of transistors to be fabricated with a threshold voltages of about 0.3 to 0.5 volts (so-called ultra-high VT or UHVT transistors). In this type of illustrative environment, transistor T1 may be implemented with an LVT transistor (e.g., VT1=0.1 volts) and transistor T2 may be implemented with a UHVT transistor (e.g., VT2=0.4 volts), as an example. Other illustrative configurations for T1/T2 that may be implemented in this type of process environment are LVT/HVT and LVT/UHVT pairs. Stacked transistors with T1/T2 configurations of LVT/LVT, HVT/HVT, or UHVT/UHVT may also be used, although these configurations will typically exhibit somewhat larger Iboff values then configurations in which VT1 is less than VT2.

Stacked transistors such as transistor TN of FIG. 13 and transistor TP of FIG. 14 may be used as pull-down or pull-up transistors in an interconnect path (e.g., interposed between pass transistors and buffers), in memory cells 20, or in other circuitry on device 10. Asymmetric transistors may also be used in these circuits.

As an example, transistors such as transistors M1 and M3 (and, if desired, transistors M2 and M4) in bistable elements BE of cells 20 (see, e.g., FIGS. 11 and 12) may be formed using stacked transistors (e.g., stacked transistors in which transistor T1 has a lower threshold voltage than transistor T2). This type of stacked transistor memory cell circuit may be used with or without one or more asymmetric transistors (e.g., asymmetric address transistor M5 of FIGS. 11 and 12, an optional asymmetric transistor for clear transistor M6 of FIG. 11, asymmetric transistor M6 of FIG. 12, etc.).

If desired, stacked transistors and/or asymmetric transistors may be used in memory cells with bistable elements that are formed from more than four transistors (i.e., more transistors than are contained in a pair of cross-coupled inverters). For example, it may be desirable to form a bistable element from four interconnected inverter-like circuits to provide enhanced immunity to soft error upset events due to radiation strikes. In this type of arrangement, eight transistors may be used to implement bistable element BE.

Figure 16:
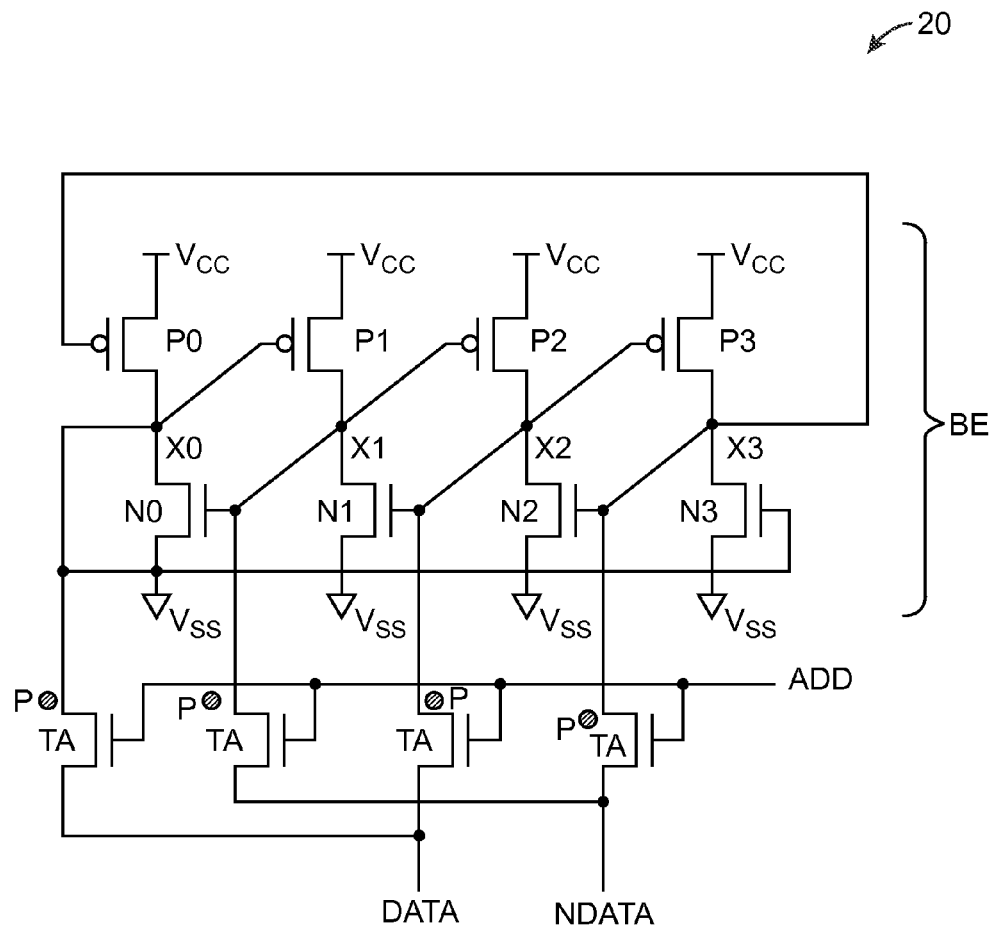
FIG. 16 is a diagram of an illustrative memory cell based on four interconnected inverter-like circuits of the type that may include stacked transistors and asymmetric transistors in accordance with an embodiment of the present invention.

FIG. 16 is a diagram of an illustrative memory cell 20 that has a bistable element BE that is based on four interconnected inverter-like circuits. As shown in FIG. 16, each inverter-like circuit includes a p-channel transistor and an n-channel transistor. The first inverter-like circuit includes p-channel transistor P0 and n-channel transistor N0, the second inverter-like circuit includes p-channel transistor P1 and n-channel transistor N1, the third inverter-like circuit includes p-channel transistor P2 and n-channel transistor N2, and the fourth inverter-like circuit includes p-channel transistor P3 and n-channel transistor N3.

Data can be conveyed over true and complement data lines DATA and NDATA. Address signal ADD may be used to control address transistors TA. Memory cell 20 may be cleared by loading logic zeros into cell 20. Differential reading and writing operations may be performed using differential data lines DATA and NDATA.

There are four labeled nodes in memory element 20 of FIG. 16: X0, X1, X2, and X3. Any of these nodes may be used as output 38 of FIG. 2. For example, node X2 may be connected to output 38 of FIG. 2.

Memory element 20 exhibits bistable operation. When memory element has been loaded with a "1," the values of X0, X1, X2, and X3 will be "1," "0,", "1," and "0," respectively. When memory element has been loaded with a "0," the values of X0, X1, X2, and X3 will be "0," "1,", "0," and "1," respectively. The architecture of memory element 20 of FIG. 16 is more distributed than a conventional memory element based on a pair of cross-coupled inverters. This distributed nature tends to make cells of the type shown in FIG. 16 more immune to radiation-induced upset events, at the expense of a somewhat higher transistor count. If desired, different types of circuits may be used for clearing cell 20, for reading data from cell 20, and for writing data into cell 20. For example, different numbers of address transistors, clear transistors, and other transistors may be used in accessing cell 20. The arrangement of FIG. 16 is merely an example.

In the illustrative configuration of FIG. 16, data may be loaded into memory element 20 by asserting address signal ADD.

Consider, as an example, the situation in which it is desired to load a 1 onto node X2. If node X2 is already high, no transitions will take place during data loading operations. If, however, the current state of node X2 is low, transitions will occur.

When loading a logic one onto a low node X2, data signal DATA will be 1 (high) and its complement NDATA will be 0 (low). While DATA is high, address line ADD is taken high to turn on transistors TA. When transistors TA are turned on by the high ADD signal, transistors TA drive logic one values onto nodes X2 and X0 and drive logic zero values onto nodes X1 and X3. When loading a logic zero, these signal values are reversed. During read operations, the values of the signals on lines DATA and NDATA are monitored using sense amplifier circuitry while address signal ADD is asserted.

In memory cell 20 of FIG. 16, transistors N0, N1, N2, and N3 may be implemented as stacked transistors. For example, transistor N0 may be implemented using transistor TN of FIG. 13, transistor N1 may be implemented using transistor TN of FIG. 13, transistor N2 may be implemented using transistor TN of FIG. 13, and transistor N3 may be implemented using transistor TN of FIG. 13. The p-channel transistors P0, P1, P2, and P3 may also be implemented using stacked transistors. For example, transistors P0, P1, P2, and P3 may each be implemented using a stacked transistor such as stacked transistor TP of FIG. 14.

Memory cell 20 of FIG. 16 may use asymmetric transistors. For example, transistors TA may be provided with energy-barrier-inducing pocket implants P, as shown in FIG. 16 or may be provided with mixed gates. Stacked transistor configurations may be used for a memory cell of the type shown in FIG. 16 without using asymmetric transistors or may be used in a memory cell of the type shown in FIG. 16 that has one or more asymmetric transistors. For example, transistors N0, N1, N2, and N3 may be implemented as stacked transistors and transistors TA may all be asymmetric transistors. If desired, transistors TA may be implemented using asymmetric transistors without using any stacked transistors in cell 20 of FIG. 16. In general, any suitable combination of stacked and asymmetric transistors may be used. These are merely illustrative examples.

Figure 17:
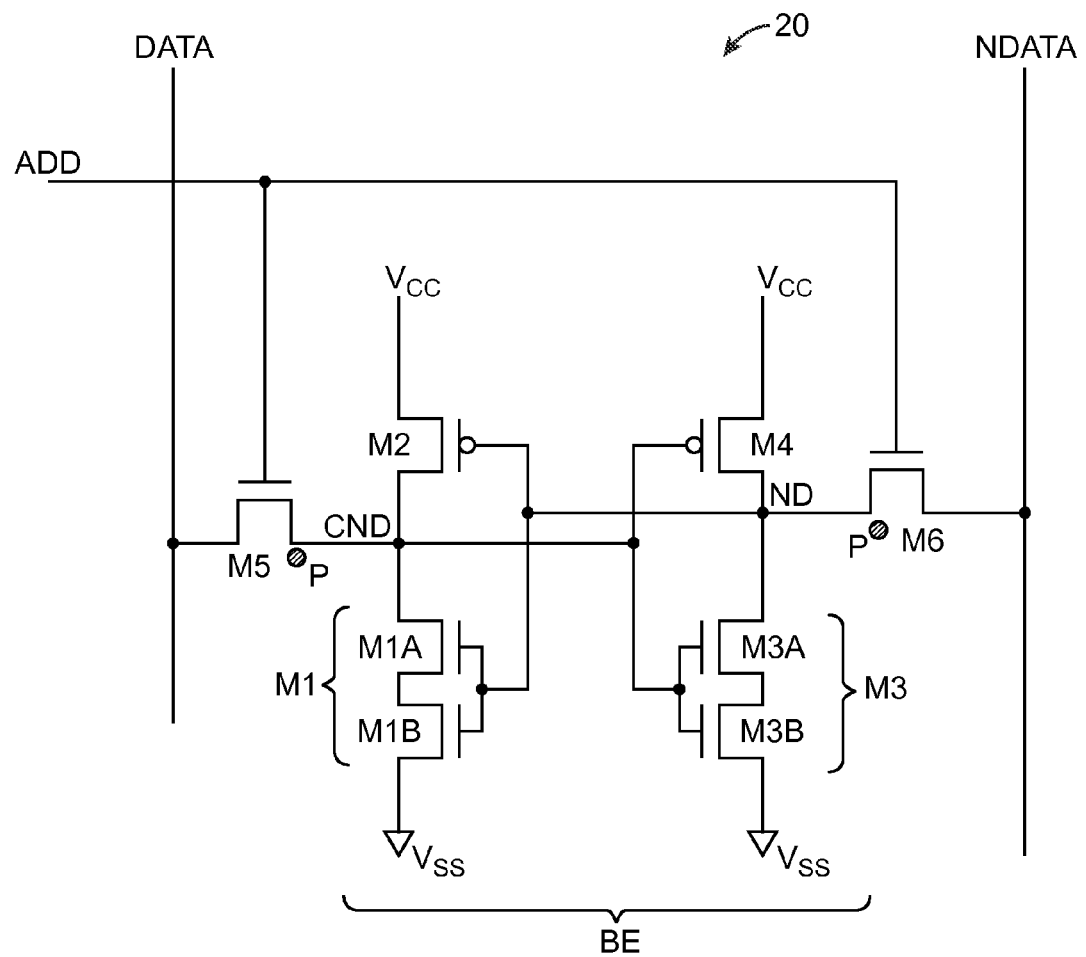
FIG. 17 is a diagram of a memory cell showing how the n-channel inverter transistors may be implemented using stacked transistors and how the address transistors can be implemented using asymmetric transistors in accordance with an embodiment of the present invention.

FIG. 17 is a diagram of a memory cell 20 showing how n-channel inverter transistors M1 and M3 in bistable element BE may be implemented using stacked transistors. The p-channel transistors in memory cell 20 of FIG. 17 may be implemented as stacked transistors or as non-stacked transistors.

Memory cell 20 of FIG. 17 uses a differential data writing scheme and a differential data reading scheme. During data writing operations, address signal ADD is asserted, while data to be loaded is placed in true and complement form on respective true and complement data lines DATA and NDATA. During data reading operations, the signals DATA and NDATA are monitored (e.g., using sense amplifier circuitry) while address signal ADD is asserted.

If desired, address transistors M5 and M6 may be implemented using asymmetric transistors. For example, transistors M5 and M6 may be provided with pocket implants P as shown in FIG. 17 or transistors M5 and M6 may be provided with dual gate structures to produce energy barriers EB.

The foregoing is merely illustrative of the principles of this invention and various modifications can be made by those skilled in the art without departing from the scope and spirit of the invention.

What is claimed is:

1. An integrated circuit, comprising:
an array of memory cells loaded with respective data bits, each memory cell having an output at which a static output signal is produced based on the data bit loaded into that memory cell; and
programmable circuitry including a plurality of programmable transistors, each programmable transistor having a gate that is electrically connected to a respective one of the outputs to receive a respective one of the static output signals, wherein the memory cells each include a first asymmetric transistor that exhibits a strong mode of operation and a weak mode of operation and a second asymmetric transistor with first and second source-drains, wherein the first source-drain of the second asymmetric transistor is directly connected to the output of that memory cell, and wherein the second asymmetric transistor has an energy-barrier-inducing implant at its second source-drain.

2. The integrated circuit defined in claim 1 wherein the first asymmetric transistor of each memory cell comprises an address transistor having first and second source-drains of a first doping type and having an energy-barrier-inducing implant at its second source drain, wherein the energy-barrier-inducing implant of the first asymmetric transistor has a second doping type opposite to the first doping type.

3. The integrated circuit defined in claim 2 wherein the first doping type comprises n-type and wherein the second doping type comprises p-type.

4. The integrated circuit defined in claim 1 wherein the memory cells each include at least one stacked transistor.

5. The integrated circuit defined in claim 1 wherein each of the memory cells includes two inverters, wherein each of the inverters has a p-channel transistor connected in series with a pair of n-channel transistors, and wherein each pair of n-channel transistors includes first and second series-connected n-channel transistors with different threshold voltages.

6. The integrated circuit defined in claim 1 wherein each of the memory cells includes a bistable element formed from four interconnected inverter-like circuits.

7. The integrated circuit defined in claim 6 wherein each inverter-like circuit includes a p-channel transistor and an n-channel transistor connected in series.

8. The integrated circuit defined in claim 1 wherein each of the memory cells includes a bistable element having at least eight transistors.

9. The integrated circuit defined in claim 1 wherein each programmable transistor in the plurality of programmable transistors has a first source-drain connected to a first logic region and a second source-drain connected to a second logic region and wherein each programmable transistor is configured to selectively convey user signals between the first and second logic regions connected to that programmable transistor.

* * * * *